United States Patent
Wu et al.

(10) Patent No.: US 6,536,130 B1
(45) Date of Patent: Mar. 25, 2003

(54) OVERLAY MARK FOR CONCURRENTLY MONITORING ALIGNMENT ACCURACY, FOCUS, LEVELING AND ASTIGMATISM AND METHOD OF APPLICATION THEREOF

(75) Inventors: Te-Hung Wu, Kaohsiung (TW); Jung-Yu Hsieh, Taipei Hsien (TW); Hsiu-Man Chang, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/998,286

(22) Filed: Nov. 30, 2001

(30) Foreign Application Priority Data

Nov. 7, 2001 (TW) ........................ 90127629 A

(51) Int. Cl.$^7$ ................................ G01B 11/00
(52) U.S. Cl. ........................ 33/645; 414/936
(58) Field of Search ................ 33/645, 613, 533; 414/935–941

(56) References Cited

U.S. PATENT DOCUMENTS 4,356,223 A * 10/1982 Iida et al. ............... 33/613
5,504,999 A * 4/1996 Barr ....................... 33/645
5,557,855 A * 9/1996 Hwang .................... 33/613

* cited by examiner

Primary Examiner—Christopher W. Fulton
(74) Attorney, Agent, or Firm—Charles C. H. Wu; Wu & Cheung, LLP

(57) ABSTRACT

An overlay mark for concurrently monitoring alignment accuracy, focus, leveling and astigmatism and a method of application thereof are disclosed. The overlay mark comprises four inner bars and four outer bars formed at the corners of exposure areas. The inner bar has a sawtooth area and a bar-shaped area, and the outer bar is a fore-layer etched pattern. Both the inner bars and the outer bars are formed into rectangles, and each bar is one side of a rectangle and none of the sides are connected. The sawtooth areas of the inner bars disposed on opposite sides are located at a same position. The rectangle formed by the outer bars encloses the rectangle formed by the inner bars. During the monitoring process, a testing beam scans across a scan area being divided into two areas, i.e., one being the outer bars and the sawtooth area of the inner bars, and the other one being the outer bars and the bar-shaped area of the inner bars.

14 Claims, 3 Drawing Sheets

OVERLAY MARK FOR CONCURRENTLY MONITORING ALIGNMENT ACCURACY, FOCUS, LEVELING AND ASTIGMATISM AND METHOD OF APPLICATION THEREOF

CROSS-REFERENCE TO RELATED APPLICATION

This application claims the priority benefit of Taiwan application serial no. 90127629, filed Nov. 7, 2001.

BACKGROUND OF THE INVENTION

1. Field of the Invention

The present invention relates to an overlay mark and method of application thereof, and in particular, an overlay mark for concurrently monitoring the alignment accuracy, focus, leveling and astigmatism and method of application the overlay mark.

2. Description of the Related Art

As the dimension of the semiconductor becomes smaller, and with higher levels of integration, the fabrication processes are more complicated and more difficult. Thus, the direction of semiconductor manufacturers has turned to monitoring and controlling, by employing real-time measuring devices, to real-time respond/solve problems so as to lower damages caused by fabrication process errors.

Generally, other than the control of the critical dimension of a wafer, the factor governing the success or failure of a wafer photolithography process is alignment accuracy. Thus, alignment accuracy measurement, or overlay error measurement, is an important task in the semiconductor fabrication process. An overlay mark is applied as a tool for measuring overlay error and is used to determine the alignment accuracy of the pattern of a photoresist layer after a photolithography process with that of a previous layer over the chip.

FIG. 1 is an aerial view of a conventional overlay mark for monitoring alignment accuracy.

Referring to FIG. 1, an overlay mark is formed on a specific wafer, for monitoring alignment accuracy and further, the monitoring process is executed only at a specific time. The overlay mark includes four inner bars 100 and four outer bars 102, wherein the outer bars 102 represent a secured fore-layer position, and the inner bars 100 represents the pattern of the photoresist layer after the photolithography process. In other words, the outer bars 102 are used as a base for the inner bars 100. The layout is that the inner bars 100 and outer bars 102 respectively form into rectangles. Each bar is a side of the rectangle and the sides are not connected, wherein the rectangle formed by the outer bars 102 encloses the rectangle formed by the inner bars 100.

In the process of monitoring alignment accuracy, a monitoring beam scans in a scanning direction 104 across the two outer bars 102 and two inner bars 100, as shown in FIG. 1. After scanning, signals of the actual position representing respectively the outer bars 102 and the inner bars 100 are read, and, next, signals representing the mean value of the position of the two outer bars 102 are measured, compared, and the differences, i.e, overlay error, are calculated. If the overlay error is larger than the acceptable deviation value, this means that the alignment between the pattern of the photoresist layer and that of the chip has not reached the accuracy requirements, and the photoresist layer has to be removed, and a second photolithography process has to be repeated until the overlay error is smaller than the acceptable deviation value. For detailed structure of the overlay mark, refer to FIG. 1.

FIG. 2 is a sectional view taken along line I—I of FIG. 1.

FIG. 2 shows a conventional structure of an overlay mark, which has a substrate 200 having a deposition layer 202 being etched to form a trench 204, and a photoresist pattern 206 on the deposition layer 202, wherein the photoresist pattern 206 is located at the inner side of the trench 204.

The relationship of FIGS. 1 and 2 shows that the trench 204 in FIG. 2 corresponds to the outer bars 102 and the photoresist pattern 206 shown in FIG. 2 corresponds to the inner bars 100 of FIG. 1.

In the exposure process, normally the pattern shown in FIG. 1 is formed over a specific wafer and is applied as an overlay mark for the monitoring process of alignment accuracy, and the monitoring process is only executed at a specific time. Although alignment accuracy can be monitored, the time used in fabrication process is increased, and real-time monitoring of alignment accuracy is not possible. Besides, after photolithography the pattern needs to undergo multiple monitoring processes to ensure throughput of the product and to avoid the lowering of yield. The to-be-monitored items of the monitoring process include focus of the pattern, leveling and astigmatism. In order to monitor focus, leveling and astigmatism, these items have to be tested individually and therefore the production time for mass production suffers and real-time monitoring cannot be achieved.

SUMMARY OF THE INVENTION

Accordingly, it is an object of the present invention to provide an overlay mark for concurrently monitoring alignment accuracy, focus, leveling and astigmatism and a method of application thereof, wherein the throughput of production is increased and the yield of the product is improved.

Yet another object of the present invention is to provide an overlay mark for concurrently monitoring alignment accuracy, focus, leveling and astigmatism and method of application thereof. The overlay mark comprises four inner bars and four outer bars, wherein each inner bar has a sawtooth area and a bar-shaped area, and the outer bar is a fore-layer etched pattern. The layout is that the four inner bars form into a rectangle and each inner bar is one side of the rectangle. None of the sides are connected. The sawtooth areas of the inner bars disposed on opposite sides are located at a same position. The four outer bars also form into a rectangle and each outer bar is a side of the rectangle. The rectangle formed by the outer bars encloses the rectangle formed by the inner bars.

In the monitoring process, a testing beam scans in a scanning direction over a scan area. The scan area is divided into two areas. The first scan area includes the sawtooth area of the opposite two inner bars and the opposite side of the two outer bars for monitoring the focus, leveling and astigmatism of the exposure areas. The second scan area includes the opposite sides of the two outer bars and the bar-shaped area of the opposite sides of the two inner bars for monitoring alignment accuracy of the exposure areas.

The principle of monitoring of the present invention is by employing line-end shortening of inner bars having sawtooth area formed during defocus and employing the characteristic of non-influence by the defocus at the etched fore-layer of the outer bars. Thus, the inner bars of the sawtooth area cause a center shift as a result of the defocus during the measuring of alignment accuracy, and thus, by reverse calculation of the amount of center shift, a relative defocus is obtained. Based on this principle, the leveling and astigmatism can be obtained.

In accordance with the present invention, the method of monitoring is that

First, the measured center position of the outer bar is used as base, and the measured center position of the bar-shaped area of the inner bar is compared with that of the outer bar. Calculate the differences, and the alignment accuracy can then be calculated.

Next, take the earlier measured alignment accuracy of the second scan area as a reference set, i.e., the error caused by alignment accuracy is first excluded. Next, note the measured offset of the x-axis alignment accuracy of the sawtooth area. The focus can be then be computed.

Further, by measuring the offset of x-axis and y-axis alignment accuracy of the sawtooth area of the first scan region, the astigmatism can be calculated.

If leveling is to be measured, the offsets of the x-axis alignment accuracy of the sawtooth area of the inner bar of the overlay mark at the individual corners on the exposure areas are measured and then compared, then, the leveling can be computed.

Accordingly, the present invention, unlike the conventional method of forming an overlay mark on a specific wafer and executing the monitoring process at a specific time, instead forms an overlay mark over the corners of the to-be-tested exposure areas of each wafer. Thus, the present method provides real time and concurrent monitoring of alignment accuracy, focus, leveling and astigmatism so as to save fabrication time and avoid throughput from suffering. In addition, the present invention is employed directly over the product and the products can be optionally inspected, and, therefore, the production yield is greatly improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
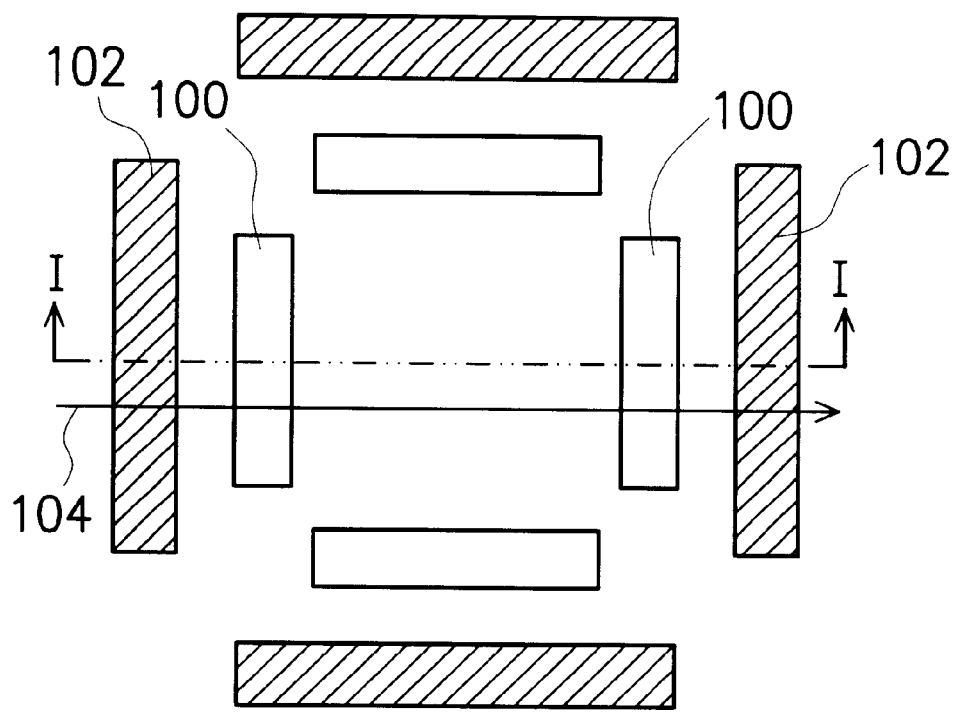
FIG. 1 is a top view of a conventional overlay mark for monitoring alignment accuracy.
Figure 2:
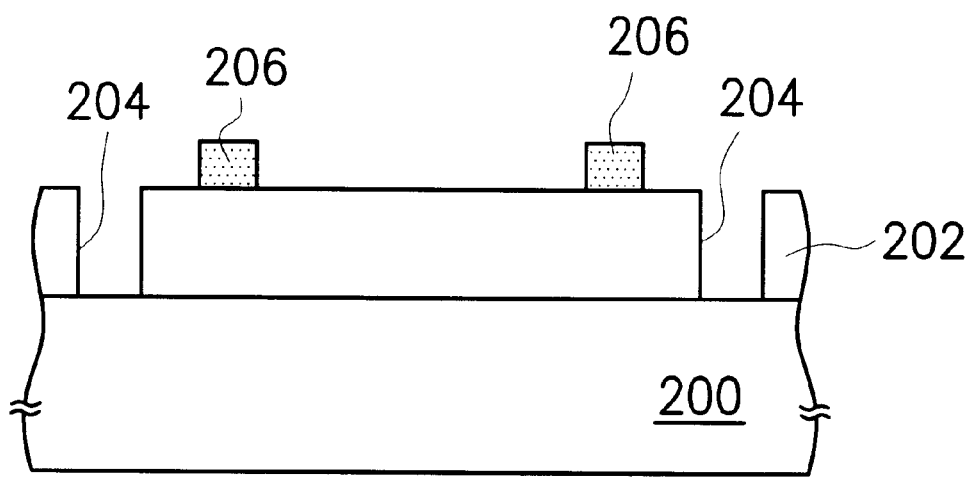
FIG. 2 is a sectional view along line I—I of FIG. 1.

Reference will now be made in detail to the present preferred embodiments of the invention, examples of which are illustrated in the accompanying drawings. Wherever possible, the same reference numbers are used in the drawings and the description to refer to the same or like parts.

Figure 3:
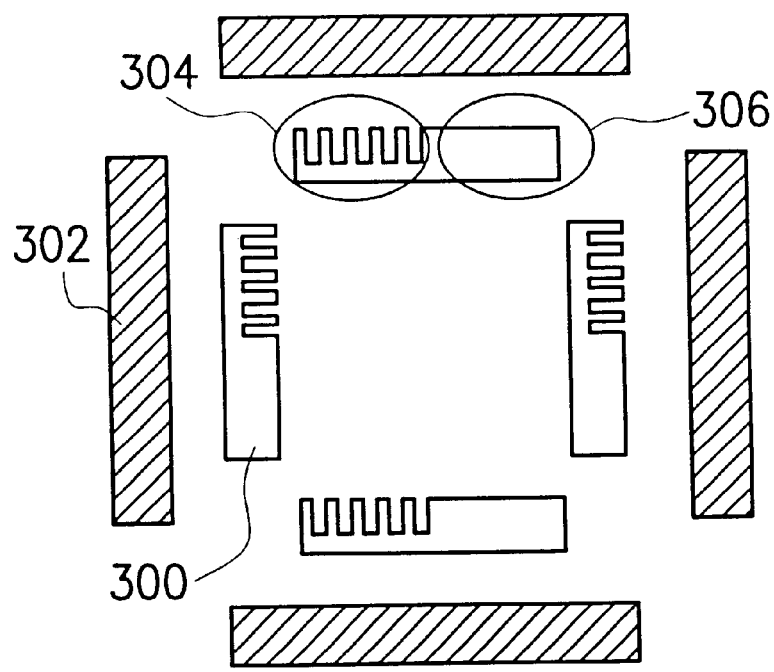
FIG. 3 is a top view of an overlay mark for concurrently monitoring the alignment accuracy, focus, leveling and astigmatism, the method of application of a preferred embodiment in accordance with the present invention.

FIG. 3 is an aerial view of an overlay mark for concurrently monitoring the alignment accuracy, focus, leveling and astigmatism and method of application thereof of a preferred embodiment of the present invention. The overlay mark of the present invention can be directly formed over the corners of the to-be exposed area of a wafer.

As shown in FIG. 3, the overlay mark includes four inner bars 300 and four outer bars 302, wherein each inner bar 300 is divided into a sawtooth area 304 and a normal bar-shaped area 306, and the detailed shape of the sawtooth area 304 is, for example, one of the longer sides being provided with sawtooth, and the other longer sides being a straight line. The outer bars 302 are all bar-shaped and are the fore-layer etched pattern of the inner bars 302, for instance, a trench. The layout is that the four inner bars 300 enclose to form a rectangle and each inner bar 300 is one side of the rectangle, and none of the sides are connected, wherein the sawtooth areas 304 of the inner bars 300 are formed at inner sides thereof and the sawtooth areas 304 of the inner bars 300 disposed on opposite sides are located at a same position. The four outer bars 302 also enclose to form a rectangle, and each outer bar 302 is one side of the rectangle, and none of the sides are connected and the rectangle formed by the outer bars 302 encloses the rectangle formed by the inner bars 300. In order to describe in detail the monitoring method of the present invention, FIGS. 4A and 4B should be referred to and the monitoring method is carried out in accordance with the overlay mark of FIG. 3.

Figure 4A:
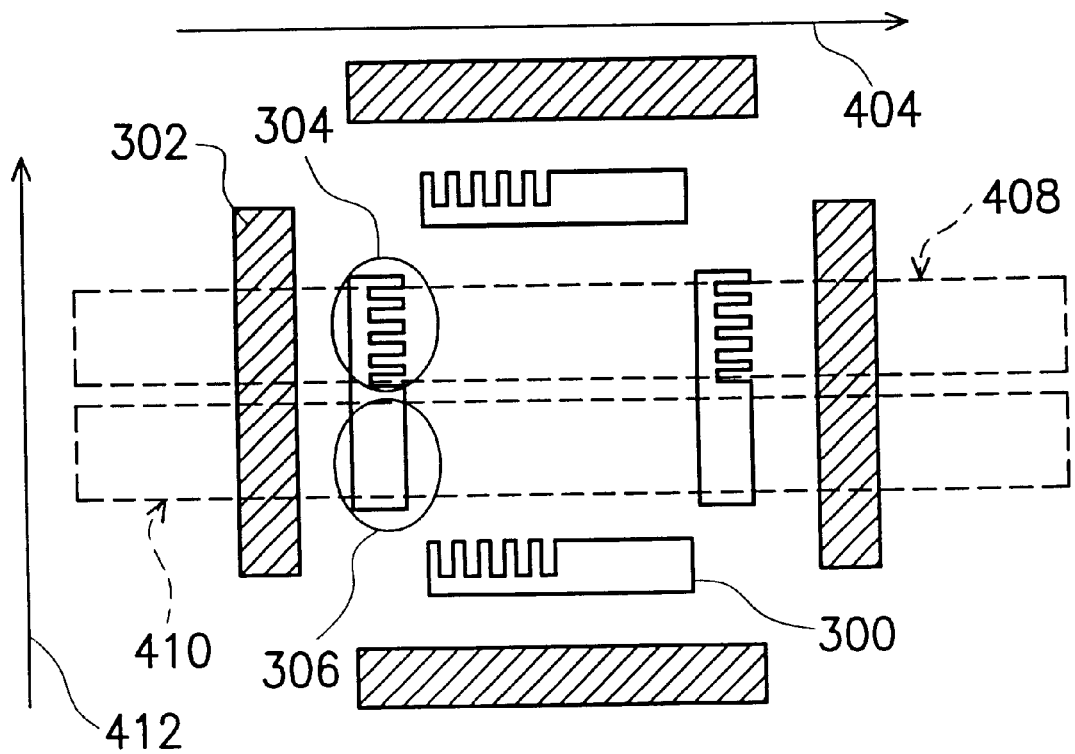
FIGS. 4A and 4B show a method of concurrently monitoring of alignment accuracy, focus, leveling and astigmatism in accordance with the preferred embodiment of the present invention.
Figure 4B:
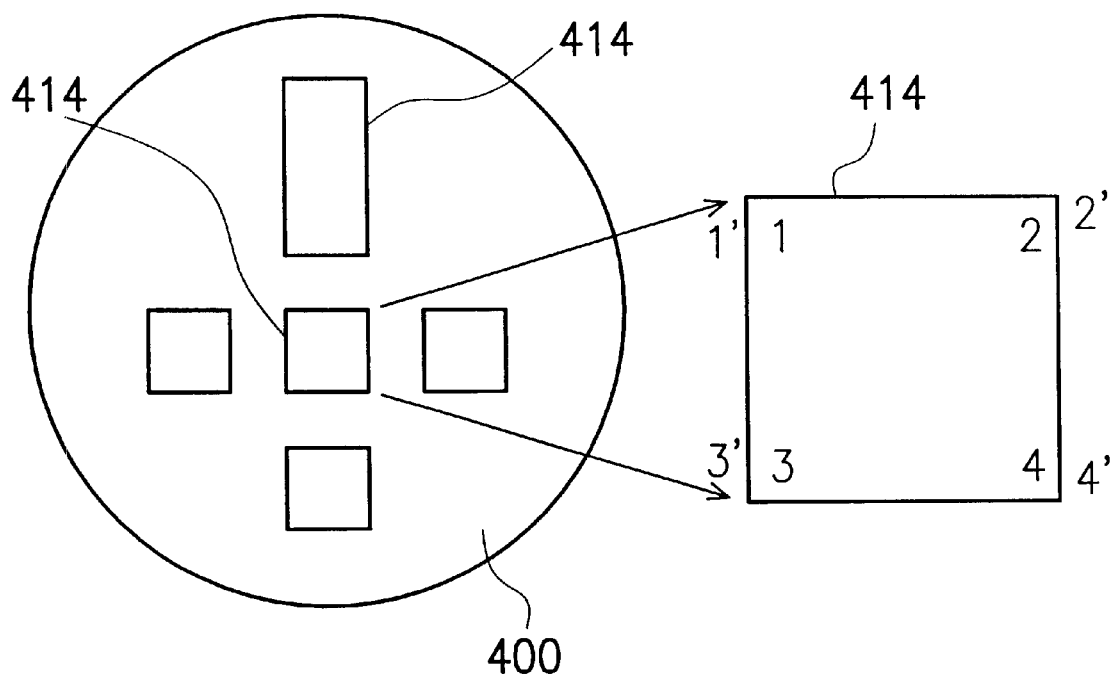

FIGS. 4A and 4B show a method of concurrently monitoring the alignment accuracy, focus, leveling and astigmatism in accordance with the preferred embodiment of the present invention.

As shown in FIG. 4A, an alignment accuracy monitoring device is employed to proceed with the monitoring process. A testing beam scans, along the scanning direction 404, the outer bars 302 and the sawtooth area 304 of the inner bar 300 of the first scan area 408, and scans the outer bars 302 and the bar-shaped area 306 of the inner bars 300 of the second scan area 410. By employing the obtained relative position of the scanned first scan area 408 and the second scan area 410, the alignment accuracy, focus, leveling and the astigmatism can be calculated, and the detailed monitoring method is as follows:

First, the actual value of alignment accuracy can be monitored from the two outer bars 302 of the second scan area 410 and the two inner bars 300. The method of monitoring is that the measured center position of the outer bar 302 is used as base, and the measured center position of the bar-shaped area 306 of the inner bars 300 is compared with that of the outer bars 302. Calculate the differences, and the alignment accuracy can be calculated.

Further, the focus can be monitored from the first scan area 408. The method of monitoring is that the earlier measured alignment accuracy of the second scan area is taken as a reference set, i.e., the error caused by alignment accuracy is first excluded. Next, read the measured offset of the x-axis 404 alignment of the sawtooth area 304. The focus can be computed.

In addition, by measuring the offset of the x-axis 404 and y-axis 412 alignment accuracy of the sawtooth area 304 of the first scan region 408, the astigmatism can be computed.

The leveling can be measured by referring to FIG. 4B.

Referring to FIG. 4B, generally, there are a plurality of exposure areas 414 that undergo exposure on a wafer 400. If the leveling of the exposure areas 414 is to be monitored, an overlay mark as shown in FIG. 3 is formed over the corners 1, 2, 3, 4 (referring the enlarged view at the right side of FIG. 4B) of the exposure areas 414. In addition, the position of the overlay mark can be located on the corner edge 1', 2', 3', 4' of each exposure area 414, wherein the corner edge of the exposure area 414, for example, is a diced path of the exposure area 414 so as to avoid affecting the design of the device, and to have the advantage of real-time monitoring. After that, measure and compare the offset of the x-axis 404 (refer to FIG. 4A) alignment accuracy of the sawtooth area 304 (referring to FIG. 3) of the inner bar of the overlay marks on the four corners 1, 2, 3 and 4. Then, the leveling can be computed.

The characteristics of the present invention include:

(1) The present invention employs an overlay mark of inner bars having sawtooth area and bar-shaped area to not only measure alignment accuracy, but also to concurrently proceed to monitor focus, leveling and astigmatism.

(2) The overlay mark of the present invention can be directly formed over the four corners of each of the exposure areas so that after the exposure process, the monitoring of alignment accuracy, focus, leveling and astigmatism can be directly proceed. This method is unlike that of the conventional method of forming a pattern for monitoring of alignment accuracy on a specific wafer at a specific time. Accordingly, the present invention has the advantages of saving time and real-time monitoring.

(3) When the present invention employs the alignment accuracy monitoring device in the monitoring process, as the overlay mark is provided on the product, so no further fabrication of an overlay mark is required. Thus, the throughput will not be damaged and the products can be optionally inspected. Therefore, the present invention can increase the yield.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An overlay mark for concurrently monitoring alignment accuracy, focus, leveling and astigmatism, comprising four inner bars, wherein each inner bar is constituted from a sawtooth area and a bar-shaped area, and the inner bars enclose to form a first rectangle, and each inner bar constitutes one side of the first rectangle, and the individual inner bars are not connected; and four outer bars, wherein each outer bar is a fore-layer etched pattern of the inner bars and the outer bars enclose to form a second rectangle, and each outer bar constitutes one side of the second rectangle, and the individual outer bars are not connected, wherein the second rectangle encloses the first rectangle.

2. The overlay mark of claim 1, wherein the sawtooth areas of the inner bars disposed on opposite sides are located at a same position.

3. The overlay mark of claim 1, wherein the sawtooth areas of the inner bars are formed at inner sides thereof.

4. An overlay mark for concurrently monitoring of alignment accuracy, focus, leveling and astigmatism, and suitable for monitoring alignment accuracy, focus, leveling, and astigmatism of a plurality of exposure areas on a wafer, the pattern thereof including a plurality of overlay marks arranged at a plurality of corners of the exposure areas, wherein each overlay mark includes four inner bars, wherein each inner bar is constituted from a sawtooth area and a bar-shaped area, and the inner bars enclose to form a first rectangle, and each inner bar constitutes one side of the first rectangle, and the individual inner bars are not connected; and four outer bars, wherein each outer bar is a fore-layer etched pattern of the inner bars and the outer bars enclose to form a second rectangle, and each outer bar constitutes one side of the second rectangle, and the individual outer bars are not connected, wherein the second rectangle encloses the first rectangle.

5. The overlay mark of claim 4, wherein the sawtooth areas of the inner bars disposed on opposite sides are located at a same position.

6. The overlay mark of claim 4, wherein the sawtooth areas of the inner bars are formed at inner sides thereof.

7. The overlay mark of claim 4, wherein the shape of the exposure areas includes a rectangle.

8. The overlay mark of claim 4, wherein the position of the overlay mark further includes the surrounding edge arranged at the corners of the exposure areas.

9. The overlay mark of claim 8, wherein the surrounding edge of the corners includes diced paths of the exposure areas.

10. An overlay mark for concurrently monitoring of alignment accuracy, focus, leveling and astigmatism, and suitable for monitoring alignment accuracy, focus, leveling, and astigmatism of a plurality of exposure areas on a wafer, the pattern thereof including a plurality of overlay marks arranged at a plurality of corners of the exposure areas, comprising the steps of respectively forming an overlay mark on a plurality of corners of the exposure areas wherein the overlay mark has four outer bars and four inner bars, wherein each inner bar is constituted from a sawtooth area and a bar-shaped area, and the inner bars enclose to form a first rectangle, and each inner bar constitutes one side of the first rectangle, and the individual inner bars are not connected; and each outer bar is a fore-layer etched pattern of the inner bars and the outer bars enclose to form a second rectangle, and each outer bar constitutes one side of the second rectangle, and the individual outer bars are not connected, wherein the second rectangle encloses the first rectangle;

scanning a first scan area to obtain the x-axis and y-axis position of the sawtooth areas of the inner bars of the first scan area for monitoring the focus, astigmatism and leveling of the exposure areas on the wafer, wherein the first scan area includes the sawtooth area of the opposite side of the two inner bars and the opposite side of the two outer bars; and scanning a second scan area to obtain the position of the bar-shaped area of the inner bars of the second scan area and the position of the bar-shaped area of the outer bars for monitoring the alignment accuracy of the exposure areas on the wafer, wherein the second scan area includes the bar-shaped area of the opposite side of the two outer bars and the opposite side of the two inner bars.

11. The method of claim 10, wherein the method of scanning the second scan area for monitoring the alignment accuracy of the exposure areas on the wafer comprises the steps of:

measuring the center position of the bar-shaped area of the outer bars;

measuring the center position of the bar-shaped areas of the inner bars; and calculating the center position of the bar-shaped area of the outer bars and the difference between the center position of the bar-shaped area of the inner bars and that of the outer bars.

12. The method of claim 10, wherein the method of scanning the first scan area to monitor the focus of the exposure areas on the wafer comprises the step of measuring the offset of the x-axis alignment accuracy of the sawtooth area of the inner bars based on alignment accuracy of the exposure areas as a reference.

13. The method of claim 10, wherein the method of scanning the first scan area to monitor the astigmatism of the exposure areas on the wafer includes the step of measuring the offset of the y-axis alignment accuracy of the sawtooth areas of the inner bars.

14. The method of claim 10, wherein the method of scanning the first scan area to monitor the leveling of the exposure areas on the wafer comprises the steps of:

measuring the offset of the x-axis alignment accuracy of the sawtooth area of the inner bars at the corners; and calculating the offset of the x-axis alignment accuracy of the sawtooth area of the inner bars at the corners.

* * * * *